(12) United States Patent
Chang et al.

(10) Patent No.: US 7,550,372 B2
(45) Date of Patent: Jun. 23, 2009

(54) METHOD OF FABRICATING CONDUCTIVE LINES WITH SILICIDE LAYER

(75) Inventors: Su-Yuan Chang, Hsinchu Hsien (TW); Min-San Huang, Hsinchu (TW); Hann-Jye Hsu, Taichung County (TW)

(73) Assignee: Powerchip Semiconductor Corp., Hsinchu (TW)

( * ) Notice: Subject to any disclaimer, the term of this patent is extended or adjusted under 35 U.S.C. 154(b) by 478 days.

(21) Appl. No.: 11/162,115

(22) Filed: Aug. 29, 2005

(65) Prior Publication Data

US 2006/0166497 A1 Jul. 27, 2006

(30) Foreign Application Priority Data

Jan. 27, 2005 (TW) .............................. 94102421 A (51) Int. Cl.
*H01L 21/44* (2006.01)
*H01L 21/4763* (2006.01)
*H01L 21/461* (2006.01)

(52) U.S. Cl. ...................... 438/581; 438/583; 438/630; 438/649; 438/651; 438/655; 438/664; 438/682; 438/721; 438/755

(58) Field of Classification Search .................. None
See application file for complete search history.

(56) References Cited

U.S. PATENT DOCUMENTS

| | | | |
|---|---|---|---|
| 6,518,206 B1 * | 2/2003 | Kumar et al. | 438/585 |
| 6,955,961 B1 * | 10/2005 | Chung | 438/241 |
| 7,169,660 B2 * | 1/2007 | Lojek | 438/199 |
| 2005/0136675 A1 * | 6/2005 | Sandhu et al. | 438/700 |
| 2005/0145928 A1 * | 7/2005 | Ogura et al. | 257/324 |
| 2005/0179098 A1 * | 8/2005 | Chan et al. | 257/412 |

* cited by examiner

*Primary Examiner*—David S Blum
*Assistant Examiner*—James M Mitchell
(74) *Attorney, Agent, or Firm*—Jianq Chyun IP Office (57) ABSTRACT

A method of fabricating conductive lines is described. A substrate having a polysilicon layer thereon is provided. A mask layer having an opening that exposes the polysilicon layer is formed on the polysilicon layer. Then, spacers are formed on the sidewalls of the mask layer. Using the mask layer and the spacers as a mask, a portion of the polysilicon layer is removed until the substrate is exposed. After that, an insulating layer that completely fills the opening is formed over the substrate. The insulating layer has an etching selectivity different from the mask layer. Thereafter, the mask layer is removed to expose the polysilicon layer and then a metal silicide layer is formed on the upper surface of the polysilicon layer.

9 Claims, 6 Drawing Sheets

METHOD OF FABRICATING CONDUCTIVE LINES WITH SILICIDE LAYER

CROSS-REFERENCE TO RELATED APPLICATION

This application claims the priority benefit of Taiwan application serial no. 94102421, filed on Jan. 27, 2005. All disclosure of the Taiwan application is incorporated herein by reference.

BACKGROUND OF THE INVENTION

1. Field of the Invention

The present invention relates to a method of fabricating semiconductor devices. More particularly, the present invention relates to a method of fabricating conductive lines.

2. Description of the Related Art

With the increase in the level of integration for semiconductor devices, the pattern and line width of devices is reduced correspondingly. As a result, the contact resistance between the gates of the devices and the conductive lines is significantly increased and the longer resistance-capacitance (RC) delay is produced leading to a slower operating speed. Because metal silicide has an electrical resistance lower than polysilicon and a higher thermal stability than most interconnect material (such as aluminum), a metal silicide layer is often formed on the connecting interface between the various electrodes of transistors and the metallic interconnect to reduce contact resistance. At present, the most commonly adopted process for forming a silicide layer in the manufacturing of semiconductor device is the self-aligned metal silicide layer.

The process of forming a self-aligned silicide layer includes several steps. First, a metallic layer is formed over a semiconductor chip. Then, the chip is transferred to a high temperature environment. If the metallic layer is in contact with silicon, then the two will react to form a silicide layer. On the other hand, if the metallic layer is not in contact with silicon, no silicide layer is formed. Thereafter, the metallic layer that has not participated in the reaction is removed. Since the aforementioned silicide process does not involve a photolithographic process, the metal silicide material can be formed on specified locations. Hence, this type of silicide fabricating process is called a self-aligned silicide process.

Figure 1:
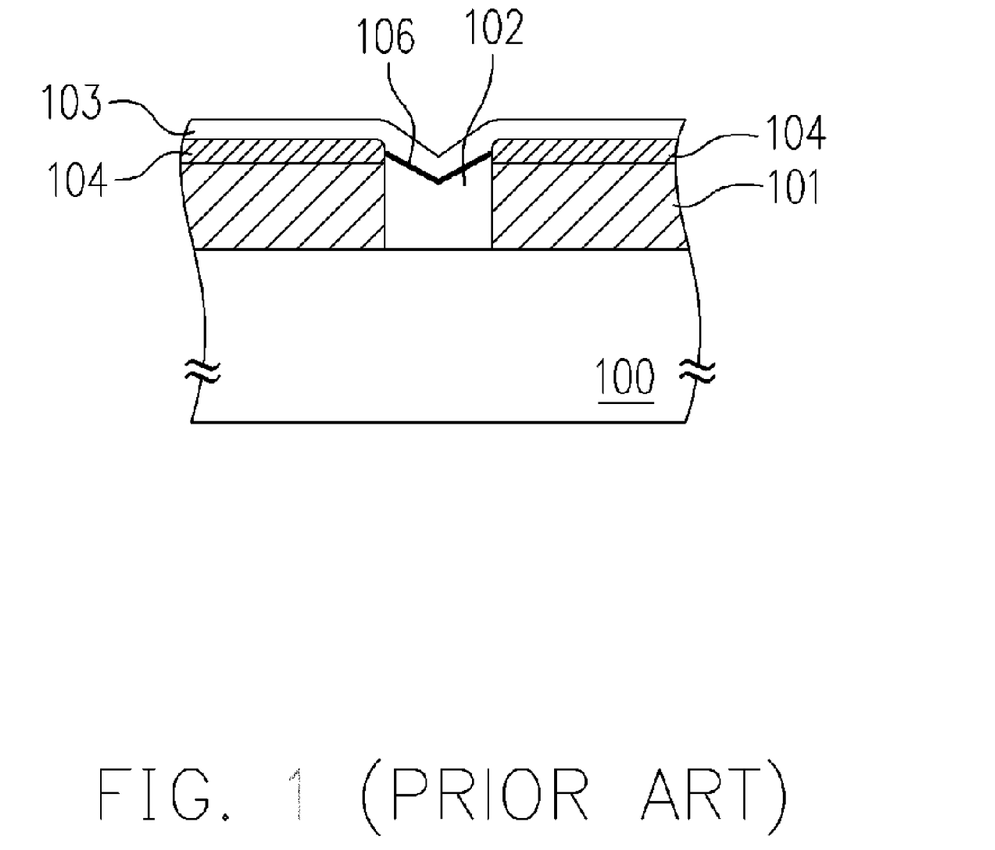
FIG. 1 is a schematic cross-sectional view of a conventional conductive line structure.

However, with the rapid progress in integrated circuit fabricating techniques, a higher level of integration in semiconductor devices is also demanded so that the pitch between neighboring conductive lines has to be set closer together. Consequently, the silicide material formed in a self-aligned silicide process frequently forms unwanted bridges between neighboring conductive lines. FIG. 1 is a schematic cross-sectional view of a conventional conductive line structure. In FIG. 1, a pair of polysilicon layers 101 (conductive lines) is formed over a substrate 100 and an insulating layer 102 is formed between the polysilicon layers 101. After forming a metallic layer 103 over the substrate 100, a high temperature annealing process is carried out to form a self-aligned silicide layer 104 on the upper surface of the polysilicon layers 101. However, during the high temperatures annealing process, some of the polysilicon material will diffuse to cause lateral diffusion. Such lateral diffusion of polysilicon material frequently leads to the formation of some silicide compound 106 on the insulating layer 102. When the pitch between two neighboring polysilicon layers 101 is small and the growth of silicide compound 106 over the insulating layer 102 is strong, an electrical bridge will form leading to the problem of having a short-circuit between neighboring conductive lines.

SUMMARY OF THE INVENTION

Accordingly, at least one objective of the present invention is to provide a method of fabricating conductive lines that prevents bridging and hence short-circuit problem after a silicide process.

At least a second objective of the present invention is to provide a method of fabricating conductive lines that permits a further reduction of the pitch between neighboring conductive lines, prevents bridging or short-circuit between neighboring conductive lines after a silicide process and provides a stable device.

To achieve these and other advantages and in accordance with the purpose of the invention, as embodied and broadly described herein, the invention provides a method of fabricating conductive lines having the following steps. First, a substrate having a polysilicon layer thereon is provided. Then, a mask layer is formed on the polysilicon layer. The mask layer has an opening that exposes a portion of the polysilicon layer. Thereafter, spacers are formed on the sidewalls of the mask layer. Using the mask layer and the spacers as a mask, a portion of the polysilicon layer is removed until the substrate is exposed. After that, an insulating layer is formed over the substrate so that the opening is completely filled. The insulating layer has an etching selectivity different from the mask layer. Then, the mask layer is removed to expose the polysilicon layer. Finally, a silicide layer is formed on the upper surface of the polysilicon layer.

According to the aforementioned method of fabricating conductive lines in one preferred embodiment of the present invention, the process of forming the silicide layer on the upper surface of the polysilicon layer includes depositing metallic material over the substrate to form a metallic layer. Then, an annealing operation is performed so that a portion of the metallic layer reacts with silicon to form the silicide layer. Thereafter, the metallic layer not participating in the reaction is removed.

According to the aforementioned method of fabricating the conductive lines in one preferred embodiment of the present invention, the metallic layer is fabricated using a refractory metallic material selected from a group consisting of cobalt, nickel, tungsten and titanium, for example.

According to the aforementioned method of fabricating the conductive lines in one preferred embodiment of the present invention, the insulating layer is fabricated using silicon nitride and the mask layer is fabricated using silicon oxide, for example.

According to the aforementioned method of fabricating the conductive lines in one preferred embodiment of the present invention, the insulating layer is fabricated using silicon oxide and the mask layer is fabricated using silicon nitride, for example.

According to the aforementioned method of fabricating the conductive lines in one preferred embodiment of the present invention, the process of forming the insulating layer over the substrate to fill the opening includes depositing insulating material over the substrate to form an insulating material layer. Thereafter, using the mask layer as a stop layer, the insulating material layer outside the opening is removed.

According to the aforementioned method of fabricating the conductive lines in one preferred embodiment of the present invention, the process of removing the insulating material layer outside the opening includes performing a chemical-mechanical polishing operation.

According to the aforementioned method of fabricating the conductive lines in one preferred embodiment of the present invention, the spacers and the mask layer are fabricated using an identical material.

According to the aforementioned method of fabricating the conductive lines in one preferred embodiment of the present invention, the process of removing the mask layer until the polysilicon layer is exposed further includes removing the spacers.

According to the aforementioned method of fabricating the conductive lines in one preferred embodiment of the present invention, a portion of the insulating layer is located above the polysilicon layer.

In the aforementioned method of fabricating conductive lines, spacers are formed on the sidewalls of the patterned mask layer before using the mask layer and the spacers as a mask to etch the polysilicon layer. Thus, the pitch between neighboring polysilicon layers (conductive lines) can be reduced. Furthermore, by adjusting the thickness of the spacers, the pitch between polysilicon layers (conductive lines) can be controlled. Hence, unlike the limit imposed by the resolution in a conventional photolithographic process, the pitch between neighboring polysilicon layers (conductive lines) can be further reduced to increase the overall level of integration of the devices. In addition, the insulating layer filling the space between neighboring polysilicon layers (conductive lines) is higher than the upper surface of the polysilicon layers (conductive lines). Therefore, in the process of forming the silicide layer, bridging is prevented and the possibility of having a short circuit between neighboring conductive lines is significantly reduced.

The present invention also provides an alternative method of fabricating conductive lines. First, a substrate having polysilicon layer thereon is provided. Then, a mask layer is formed on the polysilicon layer. The mask layer has an opening that exposes a portion of the polysilicon layer. Thereafter, using the mask layer as a mask, a portion of the polysilicon layer is removed until the substrate is exposed. After that, an insulating layer is formed over the substrate to fill the opening completely. The insulating layer has an etching selectivity different from the mask layer. Then, the mask layer is removed to expose the polysilicon layer. Finally, a silicide layer is formed on the upper surface of the polysilicon layer.

According to the aforementioned method of fabricating conductive lines in one preferred embodiment of the present invention, the process of forming the silicide layer on the upper surface of the polysilicon layer includes depositing metallic material over the substrate to form a metallic layer. Then, an annealing operation is performed so that a portion of the metallic layer reacts with silicon to form the silicide layer. Thereafter, the metallic layer not participating in the reaction is removed.

According to the aforementioned method of fabricating the conductive lines in one preferred embodiment of the present invention, the metallic layer is fabricated using a refractory metallic material selected from a group consisting of cobalt, nickel, tungsten and titanium, for example.

According to the aforementioned method of fabricating the conductive lines in one preferred embodiment of the present invention, the insulating layer is fabricated using silicon nitride and the mask layer is fabricated using silicon oxide, for example.

According to the aforementioned method of fabricating the conductive lines in one preferred embodiment of the present invention, the insulating layer is fabricated using silicon oxide and the mask layer is fabricated using silicon nitride, for example.

According to the aforementioned method of fabricating the conductive lines in one preferred embodiment of the present invention, the process of forming the insulating layer over the substrate to fill the opening includes depositing insulating material over the substrate to form an insulating material layer. Thereafter, using the mask layer as a stop layer, the insulating material layer outside the opening is removed. The insulating material layer is removed by performing a chemical-mechanical polishing operation or a etching back operation.

In the aforementioned method of fabricating conductive lines, the insulating layer filling the space between neighboring polysilicon layers (conductive lines) is higher than the upper surface of the polysilicon layers (conductive lines). Therefore, in the process of forming the silicide layer, bridging is prevented and the possibility of having a short circuit between neighboring conductive lines is significantly reduced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 2A:
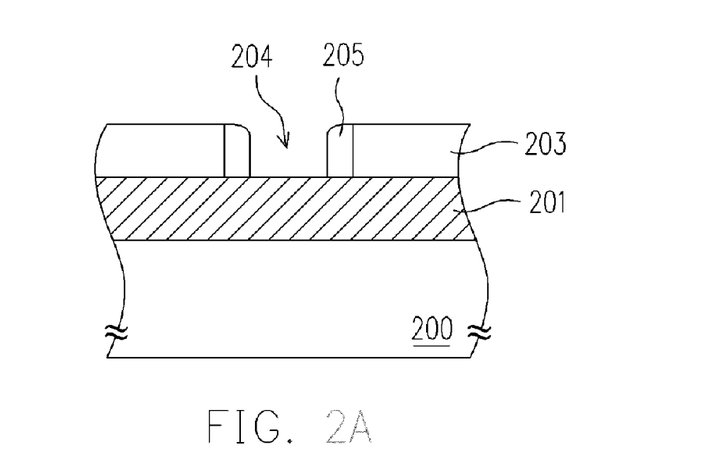
FIGS. 2A through 2F are schematic cross-sectional views showing the steps for fabricating conductive lines according to one preferred embodiment of the present invention.

FIGS. 2A through 2F are schematic cross-sectional views showing the steps for fabricating conductive lines according to one preferred embodiment of the present invention. As shown in FIG. 2A, a substrate 200 having a polysilicon layer 201 thereon is provided. The polysilicon layer 201 is formed, for example, by performing a chemical vapor deposition process. Then, a mask layer 203 is formed on the polysilicon layer 201. The mask layer 203 has an opening 204 that exposes a portion of the polysilicon layer 201. The mask layer 203 is fabricated using silicon oxide or silicon nitride, for example. The process of forming the mask layer includes depositing mask material in a chemical vapor deposition process to form a mask material layer (not shown) and then performing a photolithographic and etching process to pattern the mask material layer.

Thereafter, spacers 205 are formed on the sidewalls of the mask layer 203. The spacers 205 are fabricated using silicon oxide or silicon nitride, for example. The process of forming the spacers 205 includes depositing dielectric material in a chemical vapor deposition process to form a dielectric material layer (not shown) over the mask layer 203 and then performing an anisotropic etching operation to remove a portion of the dielectric material layer. The spacers 205 and the mask layer 203 can be fabricated from an identical material or different materials.

Figure 2B:
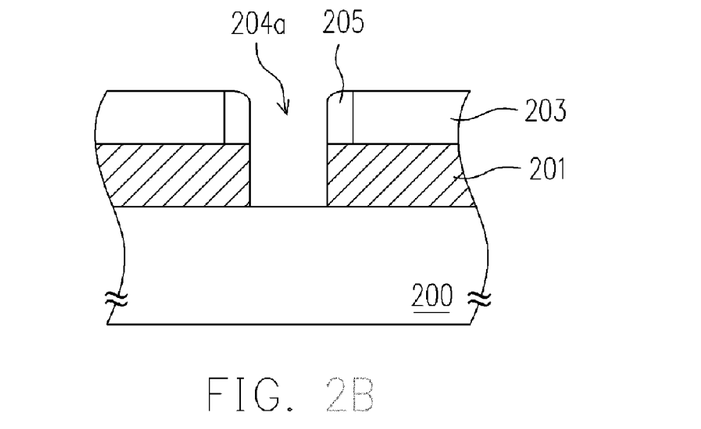

As shown in FIG. 2B, a portion of the polysilicon layer 201 is removed to form an opening 204a that exposes a portion of the substrate 200 using the spacers 205 and the mask layer as a mask. The method of removing the polysilicon layer 201 includes performing an etching operation.

Figure 2C:
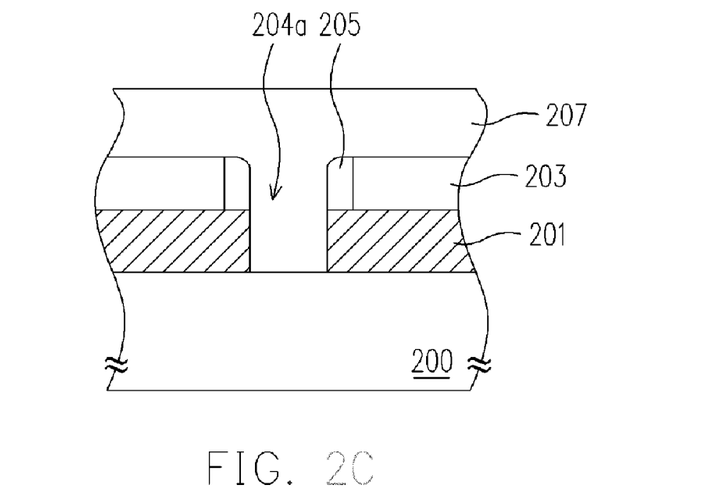
Figure 2D:
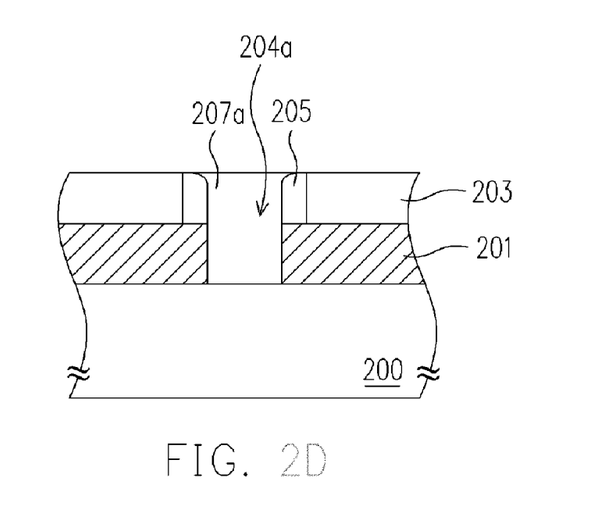

As shown in FIG. 2C, an insulating material layer 207 is formed over the substrate 200 in a chemical vapor deposition process, for example. Thereafter, as shown in FIG. 2D, the insulating material layer 207 outside the opening 204a is removed using the mask layer 203 as a stop layer so that an insulating layer 207a filling the opening 204a is formed on the substrate 200. The insulating layer 207a has an etching selectivity different from the mask layer 203. For example, the insulating layer 207a is fabricated using silicon nitride while the mask layer 203 is fabricated using silicon oxide, or alternatively, the insulating layer 207a is fabricated using silicon oxide while the mask layer 203 is fabricated using silicon nitride. The method of removing the insulating material layer 207 outside the opening 204a includes performing a chemical-mechanical polishing operation, for example.

Figure 2E:
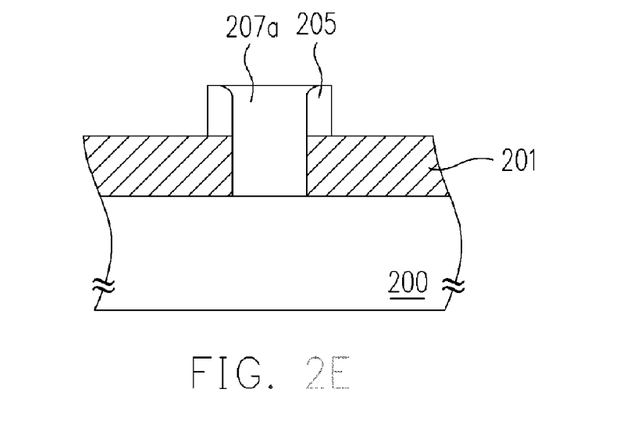

As shown in FIG. 2E, the mask layer 203 is removed to expose the polysilicon layer 201. The mask layer 203 is removed by performing an etching operation, for example.

Figure 2F:
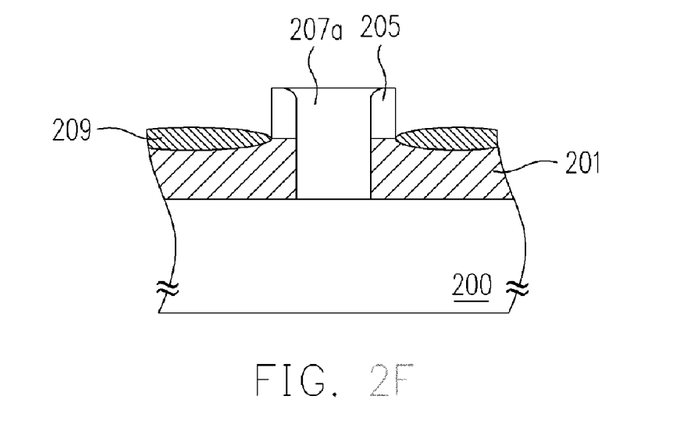

As shown in FIG. 2F, a silicide layer 209 is formed on the upper surface of the polysilicon layer 201. The method of forming the silicide layer 209 includes performing a self-aligned silicide process, for example. In the self-aligned silicide process, a metallic layer (not shown) is formed over the substrate 200. Then, an annealing operation is carried out so that a portion of the metallic layer reacts with silicon to form the silicide layer 209. Thereafter, the metallic layer not participating in the reaction is removed. The metallic layer is fabricated from a refractory metal selected from a group consisting of cobalt, nickel, tungsten and titanium, for example.

In the aforementioned embodiment, since the insulating layer 207a is higher than the upper surface of the polysilicon layers 201 (the conductive lines), bridging by the silicide layer 209 can be avoided. Furthermore, because spacers 205 are formed on the sidewalls of the mask layer 203 before removing a portion of the polysilicon layer 201 using the spacers 205 and the mask layer 203 as a mask, the pitch between neighboring polysilicon layers 201 (conductive lines) can be reduced. Moreover, by adjusting the thickness of the spacers 205, the distance separating the polysilicon layers 201 (conductive lines) can be controlled. Thus, the minimum pitch between the polysilicon layers 201 (conductive lines) is no longer limited by the resolution of photolithographic process. With a reduction in the pitch separating neighboring polysilicon layers 201 (conductive lines), the level of integration for the devices increases. In the aforementioned embodiment, the conductive lines are fabricated using polysilicon. However, the material constituting the conductive lines is not limited as such. Other types of materials including, for example, amorphous silicon or epitaxial silicon can also be used.

Figure 2G:
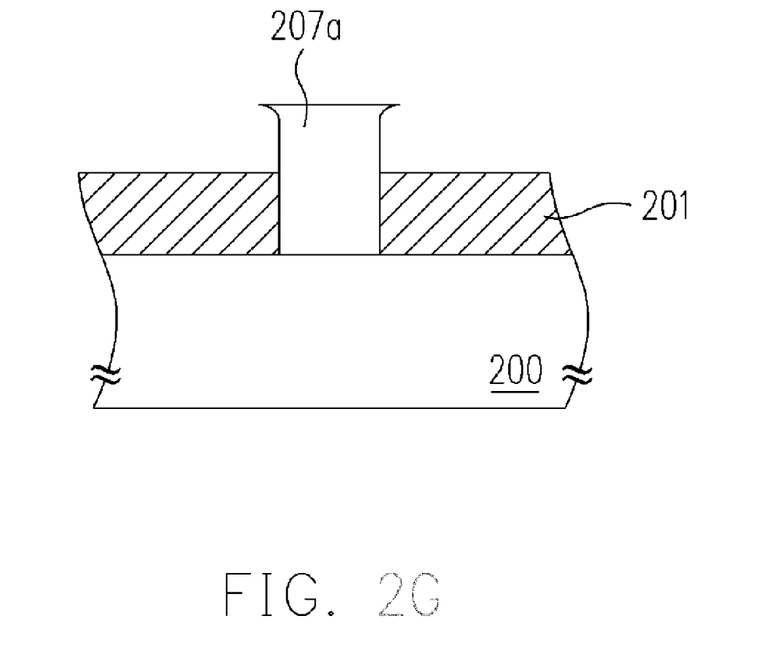
FIGS. 2G and 2H are schematic cross-sectional views showing the steps for fabricating conductive lines according to another preferred embodiment of the present invention.
Figure 2H:
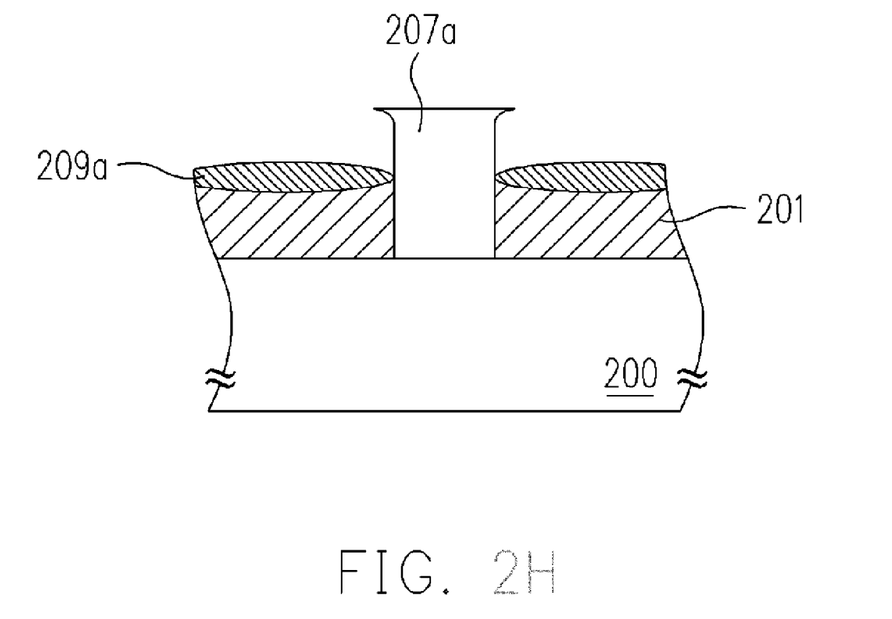

FIGS. 2G and 2H are schematic cross-sectional views showing the steps for fabricating conductive lines according to another preferred embodiment of the present invention. In fact, FIG. 2G is a continuation of the process in FIG. 2D. If the spacers 205 is fabricated using a material identical to the mask layer 203, then the spacers 205 will be removed in the step of removing the mask layer 203 as well. Thus, a portion of the insulating layer 207a is located above the polysilicon layer 201. Thereafter, as shown in FIG. 2H, a silicide layer 209a is formed on the upper surface of the polysilicon layer 201. Having a portion of the insulating layer 207a is located above the silicide layer 209a can effectively isolate the silicide layer 209a on the surface of the polysilicon 201.

One major difference of the present embodiment from the previous one is that a portion of the insulating layer 207a hangs over the polysilicon layer 201. Therefore, in the process of forming the silicide layer, the metallic layer deposited near the sharp corner region of the insulating layer 207a is thinner so that the metallic material not participated in the silicon reaction can be removed more readily. As a result, the probability of bridging by the silicide material is greatly reduced.

Figure 3A:
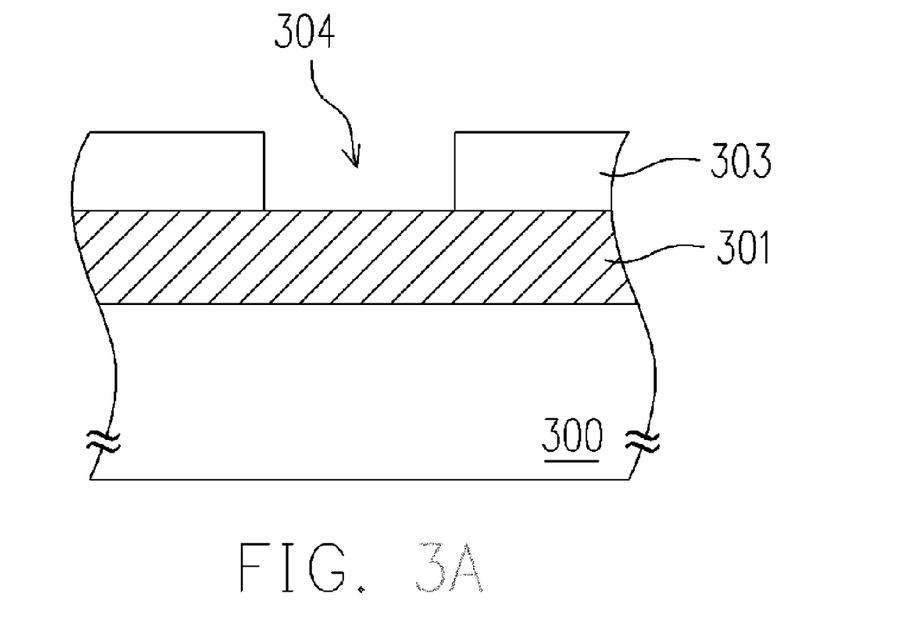
FIGS. 3A through 3D are schematic cross-sectional views showing the steps for fabricating conductive lines according to yet another preferred embodiment of the present invention.

FIGS. 3A through 3D are schematic cross-sectional views showing the steps for fabricating conductive lines according to yet another preferred embodiment of the present invention. As shown in FIG. 3A, a substrate 300 having a polysilicon layer 301 thereon is provided. The polysilicon layer 301 is formed, for example, by performing a chemical vapor deposition process. Then, a mask layer 303 is formed on the polysilicon layer 301. The mask layer 303 has an opening 304 that exposes a portion of the polysilicon layer 301. The mask layer 303 is fabricated using silicon oxide or silicon nitride, for example. The mask layer 303 is formed, for example, by depositing mask material to form a mask material layer (not shown) and then performing a photolithographic and etching process to pattern the mask material layer.

Figure 3B:
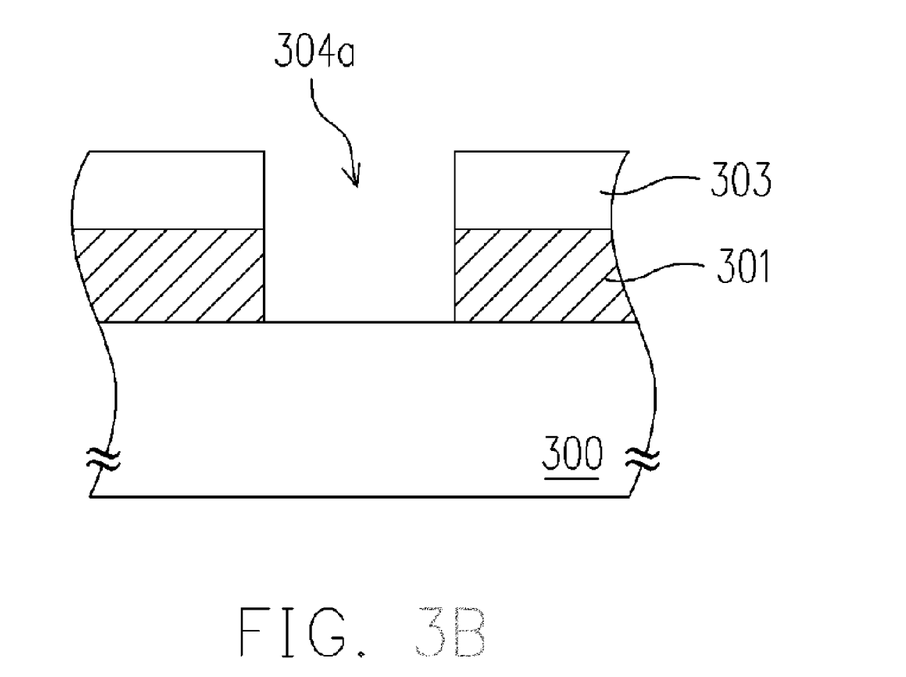

As shown in FIG. 3B, a portion of the polysilicon layer 301 is removed using the mask layer 303 as a mask to form an opening 304a that exposes a portion of the substrate 300.

Figure 3C:
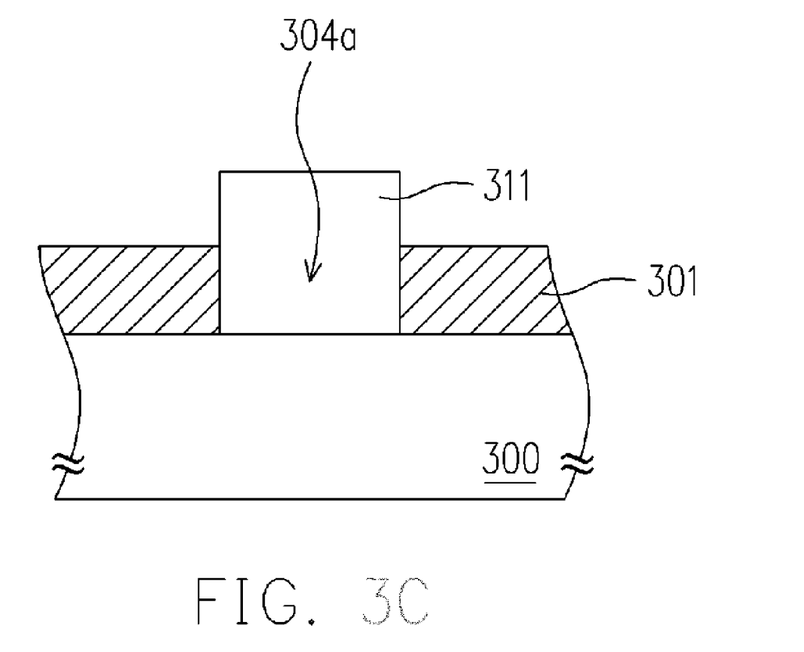

As shown in FIG. 3C, an insulating layer 311 is formed over the substrate 300 to fill the opening 304a completely. The insulating layer 311 has an etching selectivity different from the mask layer 303. For example, the insulating layer 311 is fabricated using silicon nitride while the mask layer 303 is fabricated using silicon oxide, or alternatively, the insulating layer 311 is fabricated using silicon oxide while the mask layer 303 is fabricated using silicon nitride.

The process of forming the insulating layer 311 over the substrate 300 includes depositing insulating material over the substrate 300 to form an insulating material layer (not shown) and removing a portion of the insulating material layer outside the opening 304a using the mask layer 303 as a stop layer. The method of removing the insulating material layer outside the opening 304a includes performing a chemical/mechanical polishing operation or a etching back operation, for example.

Figure 3D:
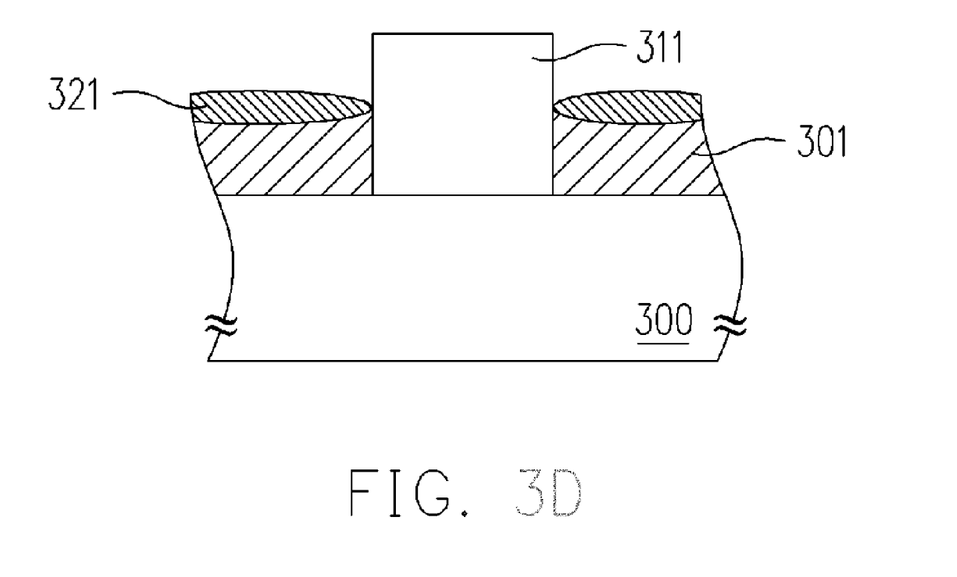

Thereafter, the mask layer 303 is removed to expose the polysilicon layer 301. As shown in FIG. 3D, a silicide layer 321 is formed on the upper surface of the polysilicon layer 301. In the present embodiment, the silicide layer 321 is formed in a self-aligned silicide process, for example. In the self-aligned silicide process, a metallic layer (not shown) is formed over the substrate 300. Then, an annealing operation is carried out so that a portion of the metallic layer reacts with silicon to form the silicide layer 321. Thereafter, the metallic layer not participating in the reaction is removed. The metallic layer is fabricated from a refractory metal selected from a group consisting of cobalt, nickel, tungsten and titanium, for example.

In the aforementioned embodiment, the insulating layer 311 is higher than the upper surface of the polysilicon layers 301 (conductive lines). Thus, the probability of bridging between neighboring polysilicon layers 301 (conductive lines) after forming the silicide layer 321 is prevented.

In the aforementioned embodiment, the conductive lines are fabricated using polysilicon. However, the material constituting the conductive lines is not limited as such. Other types of materials including, for example, amorphous silicon or epitaxial silicon can also be used.

In summary, the method of fabricating conductive lines according to the present invention can reduce the pitch between adjacent conductive lines and reduce the probability of bridging between neighboring conductive lines when a silicide layer is formed on the conductive lines. Therefore, the chance of having a short circuit between neighboring conductive lines is reduced and stability of the product is ultimately improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating conductive lines, comprising:
providing a substrate having a polysilicon layer thereon;
forming a mask layer on the polysilicon layer, wherein the mask layer has an opening that exposes a portion of the polysilicon layer;
forming spacers on the sidewalls of the opening and above the polysilicon layer;
removing a portion of the polysilicon layer using the spacers and the mask layer as a mask;
forming an insulating layer over the substrate to fill the opening, wherein the insulating layer has an etching selectivity different from the mask layer;
removing the mask layer, and the spacers not being removed so as to expose a portion of the polysilicon layer not covered by the spacers; and
forming a silicide layer on the exposed portion of the polysilicon layer.

2. The method of claim 1, wherein the step of forming a silicide layer on the upper surface of the polysilicon layer comprises:
forming a metallic layer over the substrate;
performing an annealing process so that a portion of the metallic layer reacts with silicon to form the suicide layer; and
removing the metallic layer not participated in the reaction.

3. The method of claim 2, wherein the material constituting the metallic layer comprises a refractory metal.

4. The method of claim 3, wherein the material constituting the metallic layer is selected from a group consisting of cobalt, nickel, tungsten and titanium.

5. The method of claim 1, wherein the material constituting the insulating layer comprises silicon nitride and the material constituting the mask layer comprises silicon oxide.

6. The method of claim 1, wherein the material constituting the insulating layer comprises silicon oxide and the material constituting the mask layer comprises silicon nitride.

7. The method of claim 1, wherein the step of forming the insulating layer over the substrate to fill the opening comprises:
forming an insulating material layer over the substrate; and
removing the insulating material layer outside the opening using the mask layer as a stop layer.

8. The method of claim 7, wherein the step of removing the insulating material layer outside the opening using the mask layer as a stop layer comprises performing a chemical/mechanical polishing operation.

9. The method of claim 1, wherein the spacers and the mask layer are fabricated using materials having different etching selectivity.

* * * * *